United States Patent
Liu et al.

(10) Patent No.: US 9,514,261 B2
(45) Date of Patent: Dec. 6, 2016

(54) PARTITIONING METHOD AND SYSTEM FOR 3D IC

(71) Applicant: TAIWAN SEMICONDUCTOR MANUFACTURING CO., LTD., Hsin-Chu (TW)

(72) Inventors: Heng Kai Liu, Pingzhen (TW); Hui Yu Lee, Hsin-Chu (TW); Ya Yun Liu, Jhubei (TW); Yi-Ting Lin, Hsinchu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 14/609,508

(22) Filed: Jan. 30, 2015

(65) Prior Publication Data

US 2015/0149977 A1    May 28, 2015

Related U.S. Application Data

(63) Continuation of application No. 14/057,059, filed on Oct. 18, 2013, now Pat. No. 8,966,426.

(51) Int. Cl.
*G06F 17/50* (2006.01)

(52) U.S. Cl.
CPC ................ *G06F 17/5072* (2013.01)

(58) Field of Classification Search
CPC .. G06F 17/5072; G06F 17/5045; G06F 17/50; G06F 2217/12
USPC ................ 716/122, 123, 124, 135
See application file for complete search history.

(56) References Cited

U.S. PATENT DOCUMENTS

| | | | |
|---|---|---|---|
| 5,648,911 A | 7/1997 | Grodstein et al. | |
| 7,949,984 B2* | 5/2011 | Tanamoto | G06F 17/5077 716/124 |
| 8,042,082 B2* | 10/2011 | Solomon | G06F 17/5045 365/129 |
| 8,448,119 B1* | 5/2013 | Gordin | G06F 17/5077 716/122 |
| 8,522,186 B2* | 8/2013 | Lin | G06F 17/5081 703/16 |
| 8,601,430 B1 | 12/2013 | Shroff et al. | |
| 8,775,998 B2* | 7/2014 | Morimoto | G06F 17/5045 257/528 |
| 8,930,875 B2* | 1/2015 | Yin | G06F 17/5036 716/118 |
| 8,966,426 B1* | 2/2015 | Liu | G06F 17/5072 716/100 |

(Continued)

*Primary Examiner* — Sun Lin
(74) *Attorney, Agent, or Firm* — Duane Morris LLP; Steven E. Koffs

(57) ABSTRACT

A method comprises: receiving a circuit design comprising networks of first devices fabricated by a first fabrication process; selecting second devices to be fabricated by a second process; substituting the second devices for the first devices in the networks of the circuit design; sorting the second devices within a selected one of the networks by device area from a largest device area to a smallest device area; and assigning each second device in the selected network to be fabricated in a respective tier of a plurality of tiers of a three dimensional integrated circuit (3D IC) for which a total area of second devices previously assigned to said respective tier is the smallest, the second devices being assigned sequentially according to the sorting.

20 Claims, 10 Drawing Sheets

(56) References Cited

U.S. PATENT DOCUMENTS

| | | | | |
|---|---|---|---|---|
| 9,021,414 B1* | 4/2015 | Or-Bach | ............ | G06F 17/5077 |
| | | | | 716/122 |
| 9,032,353 B2* | 5/2015 | Tsai | ................... | G06F 17/5072 |
| | | | | 716/119 |
| 2009/0055789 A1* | 2/2009 | McIlrath | ............ | G06F 17/5045 |
| | | | | 716/122 |

* cited by examiner

PARTITIONING METHOD AND SYSTEM FOR 3D IC

This application is a continuation of U.S. patent application Ser. No. 14/057,059, filed Oct. 18, 2013, which is expressly incorporated by reference herein in its entirety.

FIELD

This disclosure relates generally to semiconductor fabrication, and more specifically to three dimensional integrated circuits (3D IC).

BACKGROUND

Developments in integrated circuit technology have often focused on improving the integration density of various electronic components (e.g. transistors, capacitors, diodes, resistors, inductors, or the like) into a given chip or wafer area. Various improvements have reduced component sizes, permitting more components to be integrated on the surface of the semiconductor die. Such two-dimensional (2D) integration density improvements are physically limited by device size, the size of the die, and other limitations including the complexity of design.

IC packaging has evolved, such that multiple ICs may be vertically stacked in so-called three-dimensional ("3D") packages in order to save horizontal area on a printed circuit board ("PCB"). Some 3D IC packages include the use of through substrate vias (TSV), also referred to as through-silicon-vias, in the case of silicon-based dies. The inclusion of TSV increases the complexity of semiconductor fabrication and packaging. For example, TSV-to-TSV coupling is an additional noise source for 3D IC packages.

Another form of 3D IC integrates the fabrication process in two or more stacked tiers. Each tier has a semiconductor or dielectric layer and an interconnect structure. If an upper tier includes active devices, that upper tier has a thin semiconductor substrate or layer over the interconnect structure of the adjacent lower tier. An upper tier interconnect structure connects the devices in the upper tier to one another and to external pins. Inter-tier vias (also referred to as inter-level vias, ILV) provide additional connections between lower tier devices and upper tier devices.

DETAILED DESCRIPTION

Figure 1:
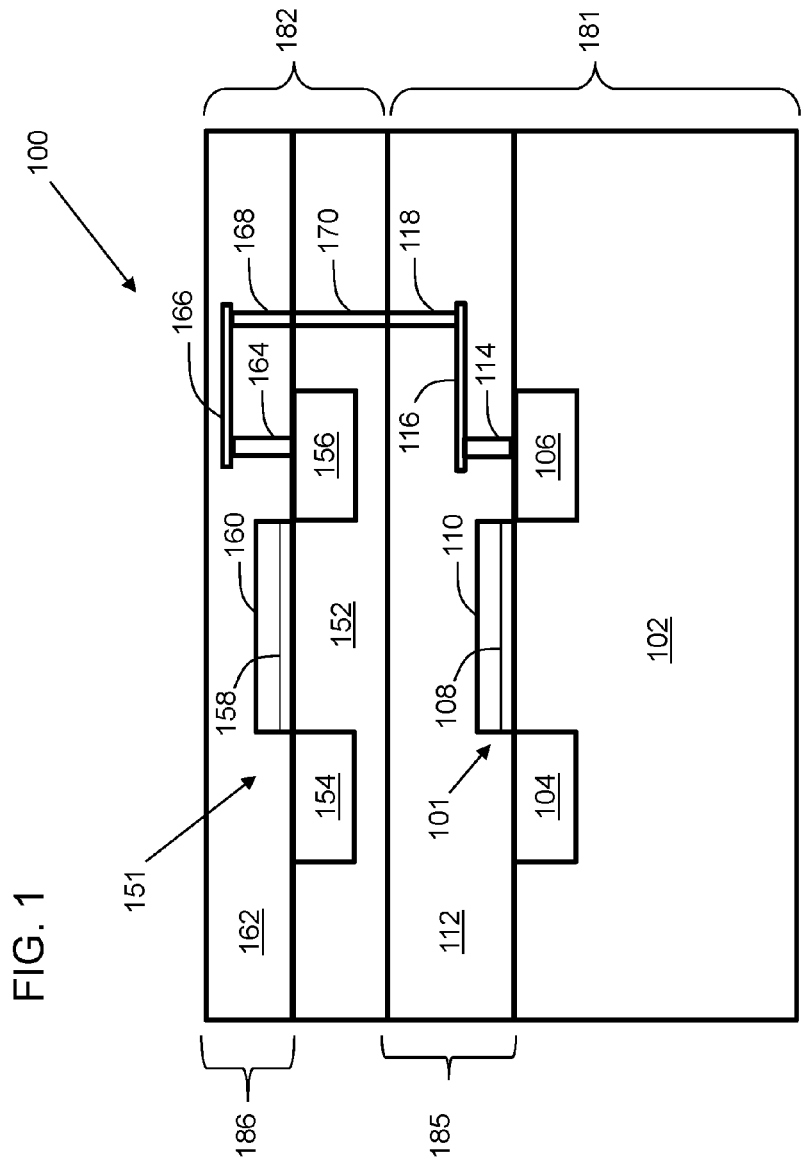
FIG. 1 is a cross-sectional view of a stacked CMOS 3D IC.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

FIG. 1 is a cross sectional diagram of a 3D IC 100 of a type having plural tiers 181, 182, each tier having a respective active device layer 102, 152. The 3D IC can be a stacked CMOS 3D IC, a single-substrate 3D IC, or a stacked-die 3D IC, for example.

The semiconductor substrate 102 comprises silicon, a III-V semiconductor, an SOI substrate or the like. In some embodiments, the semiconductor substrate 102 includes an epitaxial layer (not shown). In other embodiments, the substrate 102 includes stressor material regions (not shown) for performance enhancement. For example, the epitaxial layer can include semiconductor materials having a lattice structure different from those of the bulk semiconductor such as a layer of silicon germanium overlying a bulk silicon, or a layer of silicon overlying a bulk silicon germanium formed by a process including selective epitaxial growth (SEG). Further, the substrate 102 can include a semiconductor-on-insulator (SOI) structure.

The substrate 102 has a plurality of active and/or passive devices 101, such as transistors, diodes, capacitors and varactors. FIG. 1 shows an example of a single transistor 101 for ease of illustration, but an IC can include millions or billions of such devices. The transistor 101 has a source 104 and a drain 106 in the surface of the substrate 102, and a gate insulating layer 108 and gate electrode 110 above the surface. One or more passivation layer and/or dielectric layer 112 are provided over the active devices 101. The substrate 102 has an interconnect structure 185 between the substrate 102 and the upper tier semiconductor layer 152. The interconnect structure 185 includes contacts 114 and one or more inter-metal dielectric (IMD) layers 112 containing conductive vias 118 and/or conductive lines 116. In the example of FIG. 1, a single conductive line layer 116 is shown. In other embodiments (not shown), additional conductive via layers and/or conductive line layers are included below the upper tier semiconductor layer 152. For example, the bottom tier 181 can have 8 to 14 IMD layers, each including respective conductive lines 116 and conductive vias 118. The IMD layers comprise $SiO_2$, SiON, SiN, low-k dielectric or the like.

In some embodiments, the upper tier 182 has a semiconductor layer 152, such as silicon, a III-V semiconductor or the like, for forming a second tier of active devices 151 therein. The devices 151 include source 154, drain 156, gate insulation layer 158 and gate electrode layer 160. In some embodiments, the upper tier semiconductor layer 152 is a thin substrate or wafer (e.g., from 1 micron to 10 microns in thickness) joined to the top surface of the interconnect structure 185 of the lower tier 181. Such a configuration is referred to as a stacked CMOS configuration. In other embodiments, the semiconductor layer 152 is deposited over the interconnect structure 185.

The upper tier 182 has an interconnect structure 186 above the upper tier semiconductor layer 152. The interconnect structure 186 of the upper tier 182 includes dielectric layer 162 having contacts 164, at least one conductive line layer 166 and at least one conductive via layer 168. In some embodiments, the interconnect structure 186 has 8 to 14 IMD layers. Connections between the lower tier 181 and the upper tier 182 include inter-tier vias 170 which extend from a top surface of the semiconductor layer 152 to a bottom surface of the semiconductor layer 102.

In porting a circuit design from a first process to a 3D technology (second process) having N tiers, the IC area can ideally be reduced by a factor of M/N, where M is the number of dies or tiers in the first process, and N is the number of tiers in the second process. Efficient partitioning and placement of circuits in each tier determines how closely the design approaches the ideal shrinkage.

In some embodiments predominated by differential pair circuits, the differential pair circuits are divided between two tiers 181, 182 of a 3D IC. All of the p-MOSFETs are assigned to one single tier of the 3D IC, and all of the n-MOSFETs are assigned to a different single tier of the 3D IC.

Figure 2A:
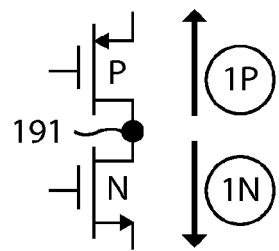
FIGS. 2A and 2C show devices to be assigned to tiers of a 3D IC.
Figure 2B:
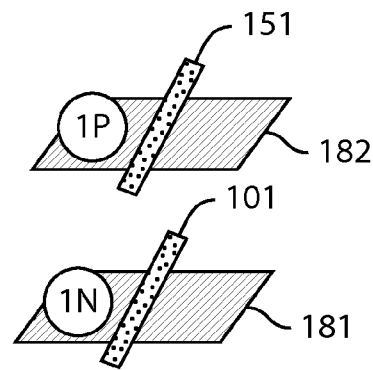
FIGS. 2B and 2D show an example of assignments for the devices of FIGS. 2A and 2C, respectively.

FIG. 2A shows a simple circuit having one p-metal oxide semiconductor field effect transistor (p-MOSFET) and one n-MOSFET. An inverter is an example of a device having one p-MOSFET and one n-MOSFET. FIG. 2B shows a method of partitioning by assigning the p-MOSFET to the top tier 182 and the n-MOSFET to the bottom tier 181.

Figure 2C:
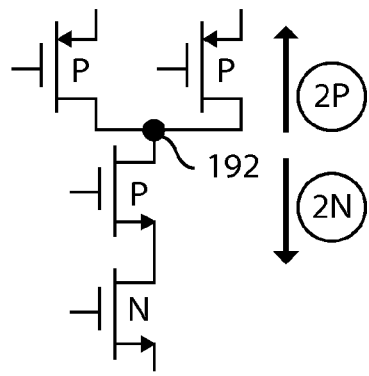
Figure 2D:
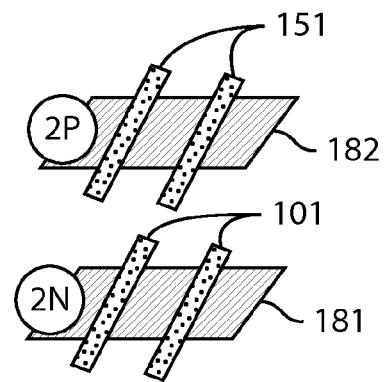

FIG. 2C is a schematic diagram of another circuit having two p-MOSFETs and 2 n-MOSFETs. FIG. 2D shows a method of partitioning by assigning both the p-MOSFETs to the top tier 182 and both the n-MOSFET to the bottom tier 181. A NAND gate is an example of a device having two p-MOSFETs and two n-MOSFETs.

The porting procedure of FIGS. 2A-2D provides efficient usage of space in the IC, for a design having a high degree of symmetry between p-MOSFETs and n-MOSFETs, and without constraints on assignment of devices to respective tiers.

Figure 3:
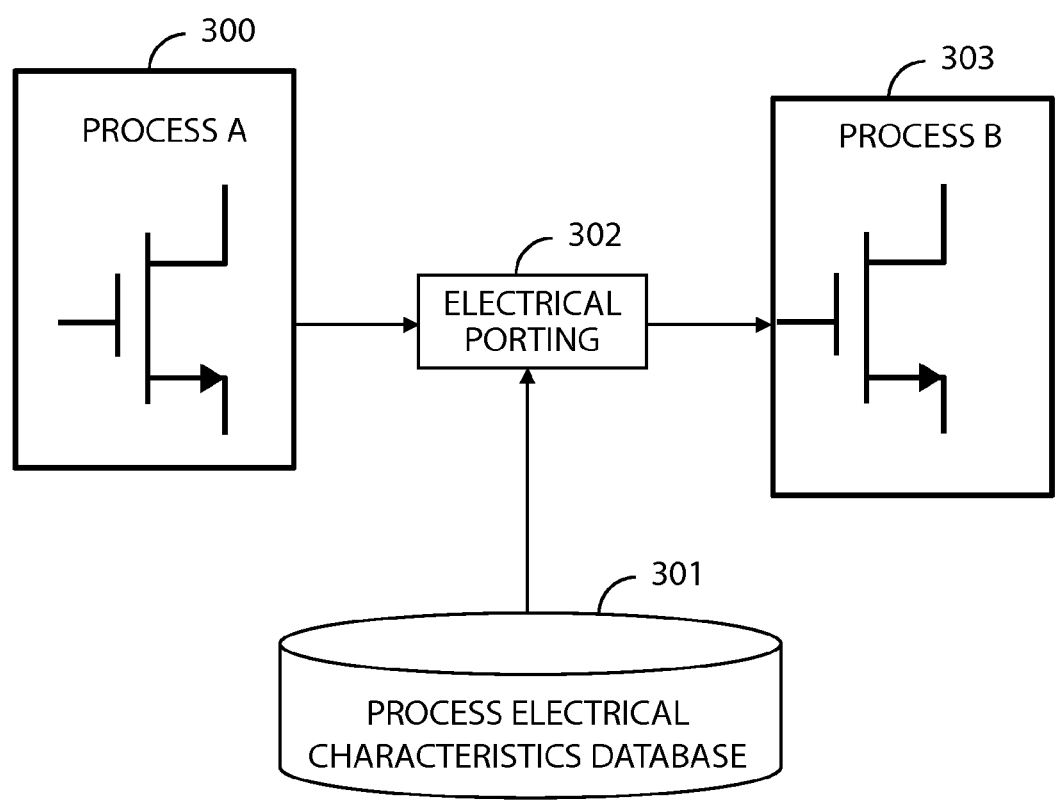
FIG. 3 is a schematic diagram of a method for porting a circuit from a first process technology to a second process technology, where the second process technology is a 3D technology.

FIG. 3 shows a more generalized approach for porting a design from a first process (which can be either a 2D single chip technology or a 3D IC technology) to a second process different from the first process.

FIG. 3 shows a device or circuit fabricated using the first process, process A. Each device to be fabricated using the first process is characterized by a plurality of parameters, referred to herein as process electrical characteristics (PEC), such as drain current Id, threshold voltage Vt, drain-source transconductance Gds, drain source resistance Rds, gate current Ig, gate capacitance Cg, and off current Ioff. These PEC values can be derived from actual electronic test data and/or SPICE level simulation. During development of the cell libraries for a new technology node, PEC for the same parameters are determined by SPICE level simulation. Table 1 shows an example of a PEC table for a first process to be stored in a non-transitory, machine readable storage medium for use by a computer performing an automated process for porting a design to a new technology. Each device is characterized by physical design parameters (length, width and the number of fingers), and by the corresponding PEC.

TABLE 1

| PEC | width (um) | length (um) | No. of fingers | Id | Gds | Gm |
|---|---|---|---|---|---|---|
| n-MOSFET | 8 | 1 | 1 | 5.70E−05 | 6.63E−06 | 5.00E−04 |
| p-MOSFET | 1 | 1 | 1 | −2.70E−06 | 3.4E−07 | 1.80E−05 |

Table 2 shows a corresponding table for a new (second) process technology, to which a design will be ported.

TABLE 2

| PEC | width (um) | length (um) | No. of fingers | Id | Gds | Gm |
|---|---|---|---|---|---|---|
| n-MOSFET 1 | 5.8 | 0.91 | 1 | 5.71E−05 | 6.62E−06 | 5.01E−04 |
| n-MOSFET 2 | 0.74 | 1.24 | 2 | 5.77E−05 | 6.88E−06 | 5.68E−04 |
| p-MOSFET 1 | 0.5 | 0.58 | 1 | −2.69E−06 | 3.41E−07 | 1.81E−05 |
| p-MOSFET 2 | 1.04 | 1.84 | 2 | −7.30E−06 | 3.56E−07 | 5.69E−05 |

Table 2 includes a plurality of n-MOSFET designs and a plurality of p-MOSFET designs. Thus, the electrical porting block 302 of FIG. 3 takes into account the PEC database 301, including the PEC of the first technology (Table 1) and the PEC of the second technology devices in Table 2. The resulting design uses the devices of the second process technology to provide the same function and meet the same performance requirements as the design when fabricated using the first technology. In addition to the electrical characteristics, the database 301 includes the width, length, and number of fingers of each device, which can be used to compute the area of each device type. In some embodiments, these dimensions are used to maximize area shrinkage when porting the design to the second process technology.

In some embodiments, if there is no second device having the same PEC as the corresponding first device in the circuit design, the system provides the user the option to update the geometry of the closest device (e.g., change the gate length, gate width or number of fingers and check the PEC impact of the second process, then select the preferred device). Should the designer choose to modify the second device parameters, the processor performs a simulation (using, for example, HSPICE, SPECTRE, ELDO, Berkely Design Automation. (EDA tools) to confirm that the modification produces PEC closer to that of the original first device. Then the designer can update the dimensions (length, width, finger) in the PEC database 301.

In some embodiments, each second device design is assumed to have a single respective set of dimensions and PEC regardless of which tier that device is fabricated on. In other embodiments, the database 301 provides greater precision by providing separate PEC and area data for each device design, for each tier. Thus, in some embodiments, an n-MOSFET having a given set of dimensions has different PEC when fabricated in the second tier than when the device having the same dimensions is fabricated in the first tier, and the PEC database 301 includes a first set of PEC for that n-MOSFET for use when it is assigned to the first tier and a second set of PEC for that n-MOSFET for use when it is assigned to the second tier.

Figure 4:
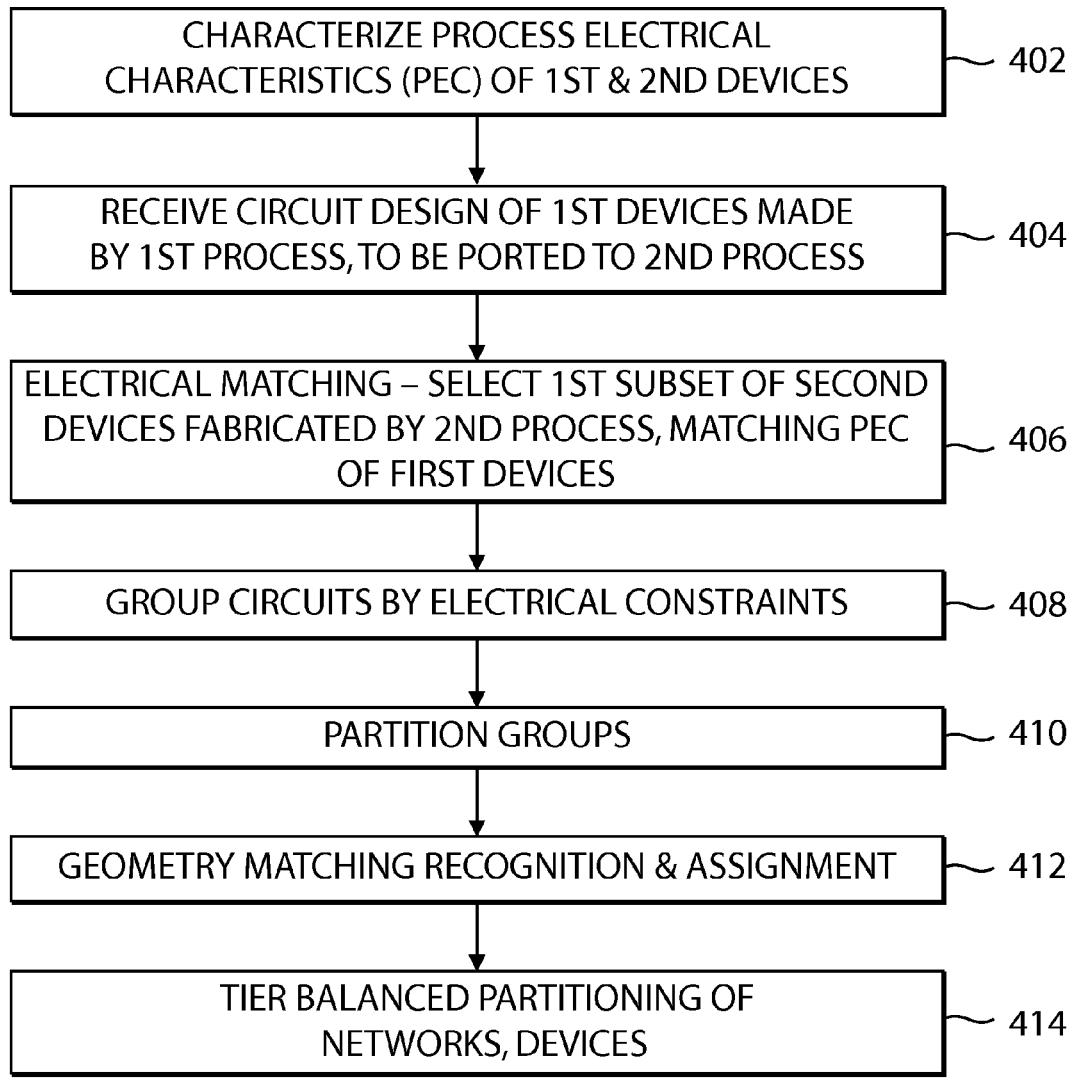
FIG. 4 is a flow chart of a method for porting a circuit to a 3D IC technology.

FIG. 4 is a flow chart of the porting process.

At step 402, the PEC database 301 is populated with the characteristics of the devices fabricated by the first technology and the devices fabricated by the second technology. The PEC database includes data corresponding a plurality of first devices fabricated by the first (older) process technology and a plurality of second devices to be fabricated by the second (newer) process technology. The PEC table 301 is stored in a non-transitory, machine readable storage medium.

At step 404, the programmed processor receives a circuit design comprising a plurality of first devices fabricated by a first fabrication process.

At step 406, the electrical matching migration is performed. The processor retrieves the electrical characteristics for the plurality of second devices from the table stored in a non-transitory, machine readable storage medium. The programmed processor selects a first subset of a plurality of second devices to be fabricated by a second process. For example, the circuit design has two transistors, one n-MOSFET and one p-MOSFET with dimensions and PEC described with reference to Table 1. The programmed processor searches to find the matching PEC devices in the second process.

Thus, a threshold decision made by the processor includes selecting the first subset of the second devices to include ones of the plurality of second devices which most closely match the process electrical characteristics of the corresponding first devices. In this example, the processor selects the n-MOSFET1 and one of the p-MOSFET2 having matching PEC performance.

For example, in Table 1, the n-MOSFET has a drain current of 5.70E-05 and the p-MOSFET has a drain current of -2.70 E-06. Of the available devices in Table 2, the most closely matching n-MOSFET is n-MOSFET 1, which has a drain current of 5.71E-05; and the most closely matching p-MOSFET is p-MOSFET 1, which has a drain current of -2.69 E-06. Thus, n-MOSFET 1 and p-MOSFET 1 are selected as the first subset of the plurality of second devices (in Table 2) to be used for fabricating the circuit design using the second technology. The selected first subset of the plurality of second devices can provide performance equivalent to that achieved using the first process technology.

At step 408, circuits and blocks of circuits are grouped according to electrical constraints. These electrical constraints can include, for example, matching constraints. If a network or circuit block that has been fabricated and qualified using the first process technology is sensitive to impedance matching, the designer can decide that such network or circuit block shall be ported together within a single tier of the 3D IC. For example, in some embodiments, the designer can choose to group all of the active devices of an analog circuit together in the same tier (which can be either the bottom tier or the upper tier). The designer can group the devices of the analog circuit together, so that regardless of what partitioning algorithm is applied to divide the remaining devices among the plurality of tiers, the devices of the grouped circuit all are assigned to the same tier.

Similarly, in some embodiments, the designer can choose to group all of the active devices of a custom logic circuit (also referred to as the designer's IP) together in the same tier (either the bottom tier or the upper tier). Further, in some embodiments, the designer can choose to group all of the active devices of a memory circuit together in the same tier (either the bottom tier or the upper tier). These are only examples, and the designer can select any circuit or network, within which all of the active devices are to be grouped in the same tier as each other.

At step 410, the computer partitions the groups into tiers. The groups are partitioned to minimize the variance of the total area of the grouped circuits assigned to each tier. That is, the groups are partitioned to minimize the between-partition differences between the respective sums of the areas of all grouped circuits in each partition. The partitioning of the grouped circuits into tiers is described below with reference to FIGS. 5 and 6.

At step 412, geometry matching recognition and assignment is performed for the circuits and devices which are not included in any of the groups in step 408. This step targets circuits (or networks) having equal numbers of n-MOSFETs and p-MOSFETs. In some embodiments, the matching recognition is performed on the layout by comparison of polygons in the N-well and P-well respectively. In other embodiments, the matching recognition is performed on the netlist.

In some embodiments, this step searches for a node (e.g., node 191 in FIG. 2A or node 192 in FIG. 2C) between an n-MOSFET and an adjacent p-MOSFET within a circuit or network. Once this node 192 is found, the design is searched for an adjacent n-MOSFET on one side of the found node, and for an adjacent p-MOSFET on the other side of the found node. This search is repeated as long as equal numbers of adjacent n-MOSFETs and adjacent p-MOSFETs are found on each side of the found node. When there are no more devices within the circuit or network on either side of the found node 191, 192, the adjacent n-MOSFET's on one side of the found node 191, 192 are assigned to a single tier of the 3D IC, and the adjacent p-MOSFET's on the other side of the found node are assigned to a different single tier of the 3D IC. For example, as shown in FIGS. 2B and 2D, all the n-MOSFET's are assigned to the lower tier 181, and all the p-MOSFET's are assigned to the upper tier 182. In other embodiments, (not shown) all the p-MOSFET'MOSFET's are assigned to the lower tier 181, and all the n-MOSFET's are assigned to the upper tier 182. Further, in 3D ICs having three or more tiers, the n-MOSFETs found in step 412 can all be assigned to any of the three or more tiers, and the p-MOSFETs can all be assigned to any other one of the three or more tiers, different than the tier in which the n-MOSFETs are assigned.

Further, in some embodiments having four tiers, the n-MOSFETs can be evenly divided among a first tier and a second tier, while the p-MOSFETs are evenly divided among a third tier and a fourth tier, where the first, second, third and fourth tiers can be stacked in any sequence with respect to each other. In some embodiments, the processor assigns each second device in the circuit or network to the one of the plurality of tiers for which a total area of devices previously assigned to that tier is smallest, the assigning performed sequentially according to a sorting by device area.

Referring again to FIG. 4, at step 414, the processor performs tier-balanced partitioning of the remaining networks and devices. The devices (nodes) within each circuit (network) are assigned to equalize the total area of devices assigned to each tier.

The sequence of FIG. 4 implicitly prioritizes three partitioning methods. First, designer-selected groups are assigned to respective single tiers. Second, geometry matching recognition divides networks having equal numbers of p-MOSFETs and n-MOSFETs between two tiers (all p-MOSFETs assigned to one tier; all n-MOSFETs assigned to a different tier). Third, the remaining networks are sequentially assigned, from largest to smallest, to approach equal area loading among tiers with each assignment.

Figure 5:
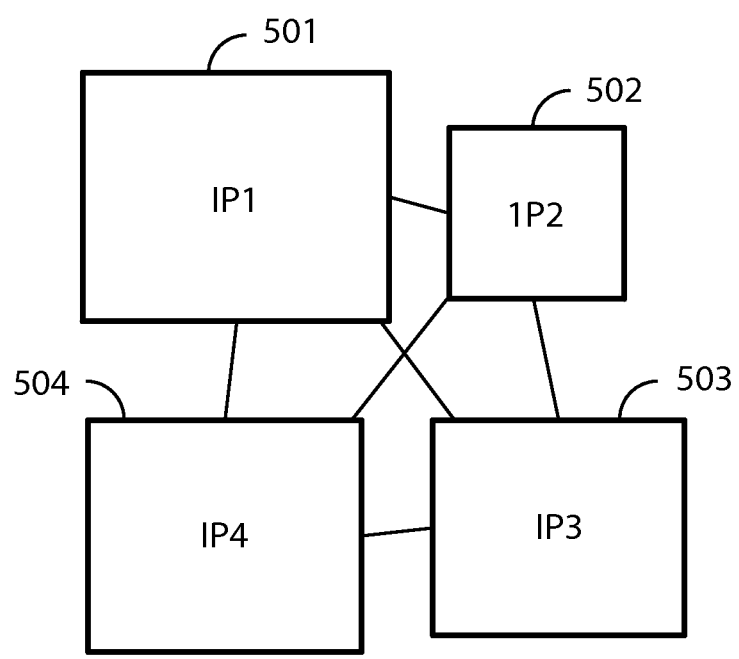
FIG. 5 is a schematic diagram of a plurality of circuits to be ported to a 3D IC technology.

FIG. 5 shows an example of a set of four groups to be partitioned, corresponding to four different custom designed logic circuits (IP blocks) 501-504. Table 3 lists exemplary total areas for the four IP blocks 501-504 shown in FIG. 5.

TABLE 3

| | Area ($\mu m^2$) |
|---|---|
| IP 1 (501) | 100 |
| IP 2 (502) | 50 |
| IP 3 (503) | 70 |
| IP 4 (504) | 80 |

Figure 6:
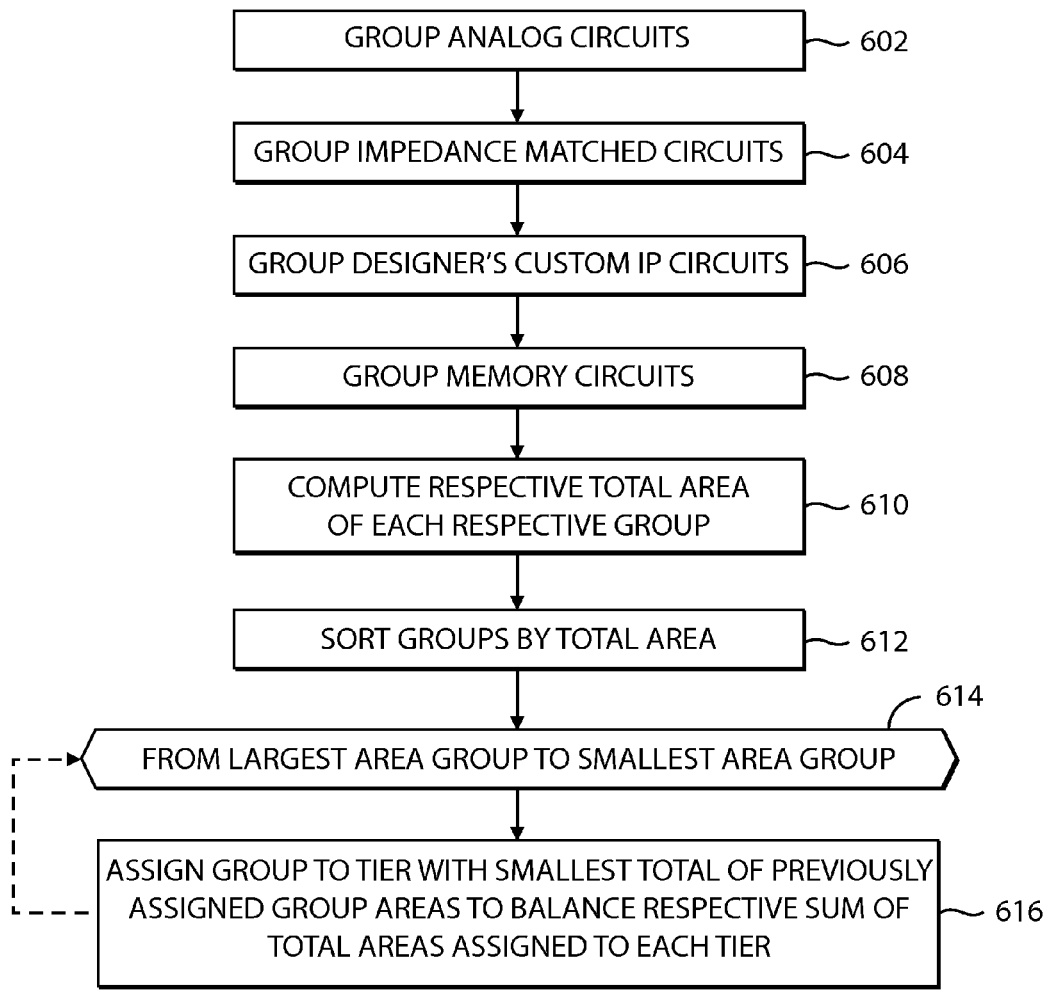
FIG. 6 is a flow chart of the group partitioning of FIG. 4.

FIG. 6 is a flow chart of a method of grouping and partitioning circuits and circuit blocks as briefly discussed above with reference to steps 408 and 410 of FIG. 4. For example, the method of FIG. 6 can be used to partition the groups 501-504 of circuits of FIG. 5.

Note that in steps 602-608, described below, all of the devices assigned to a given group are to be fabricated in the same tier as each other. In some embodiments, two or more of the circuits can be assigned to the same group. In some embodiments, the number of groups is greater than or equal to the number of tiers, and less than or equal to the number of grouped circuits. In some embodiments, two or more groups are assigned to one or more of the tiers.

At step 602, in some embodiments, each analog circuit is assigned to a respective group.

At step 604, in some embodiments, each circuit that is sensitive to impedance matching is assigned to a respective group.

At step 606, in some embodiments, each of the designer's custom logic circuits is assigned to a respective group.

At step 608, in some embodiments, each memory circuit is assigned to a respective group.

At step 610, a respective total area is determined or computed for each respective group. In some embodiments, the area of each circuit block is determined by the place and route tool, and this area can be used. In some embodiments, for each type of device in a group, the number of devices of that type is multiplied by the length times the width for that device type (as stored in the PEC database 301, FIG. 3). In the example of FIG. 5, the areas are given in Table 3, above.

At step 612, the processor sorts the groups of circuits/circuit blocks by total area. Referring to the example of FIG. 5 and Table 3, the IP blocks 501-504 are sorted into the sequence 501, 504, 503, 502.

At step 614, step 616 is repeated for each group (circuit block), from the largest area group to the smallest area group.

At step 616, each group is assigned to the tier with the smallest total of previously assigned group areas. Thus, the plurality of first circuits are divided among the tiers of the 3D IC, so as to balance a respective sum of the total areas of the first circuits assigned to each respective tier of the 3D IC.

Applying steps 614 and 616 to the example of FIG. 5, IP block 1 (501) is assigned first. Assuming that no other groups have been previously assigned, IP block 501 is assigned to tier 1. The next largest group, IP block 504 is assigned to the tier having the smallest total area of previously assigned groups, which is now tier 2. Thus, at this stage, tier 1 has been assigned a total area of 100 $\mu m^2$ and tier 2 has been assigned a total area of 80 $\mu m^2$. The group having the next largest area is IP block 503 (area=70 $\mu m^2$). IP block 503 is assigned to tier 2, which has the smallest total of previously assigned areas (80 $\mu m^2$). Now, the total area assigned to tier 2 is 150 $\mu m^2$, and tier 1 has the smallest total area of previously assigned groups (100 $\mu m^2$). The last group to be assigned is IP block 502, which has an area of 50 $\mu m^2$, and is assigned to tier 1. Thus, the total areas of circuit blocks assigned to tier 1 and tier 2 are 150 $\mu m^2$ each.

Although the example of FIG. 5 and Table 3 provides an exact equality of areas assigned to each tier, in other examples and embodiments, the total areas of the grouped circuits assigned to each tier differ from each other. Nevertheless, the method of sorting the groups by total group area, from largest to smallest, and assigning each group sequentially to the tier having the smallest total area of previously assigned groups minimizes the differences between the total areas of groups assigned to each tier.

Figure 7:
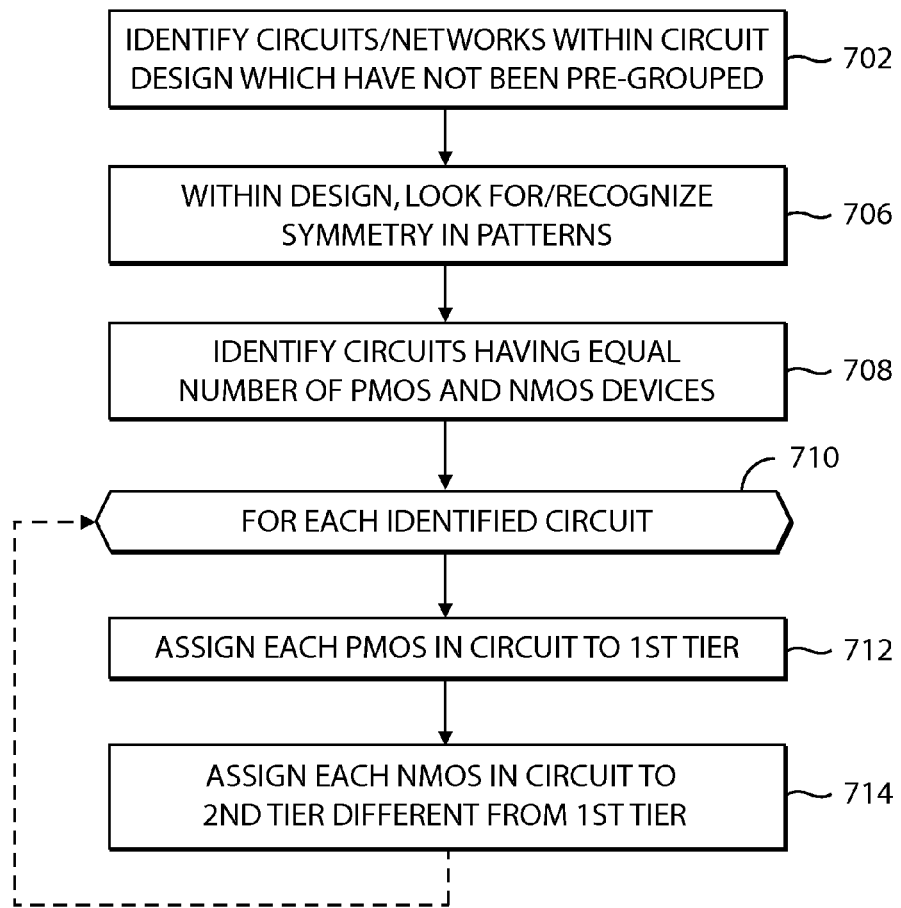
FIG. 7 is a flow chart of the geometry matching recognition and assignment of FIG. 4.

FIG. 7 is a detailed flow chart of the geometry matching recognition step 412 of FIG. 4

At step 702, the processor identifies the circuits and networks within the design which have not been grouped by the designer in step 408.

At step 706, the processor searches within the design for symmetry in circuit patterns. For example, in some embodiments, the processor locates a node (such as node 191 in FIG. 2A, or node 192 in FIG. 2C) between an n-MOSFET and an adjacent p-MOSFET.

At step 708, the processor identifies circuits having an equal number of p-MOSFETs and n-MOSFETs. For example, beginning at the node found in step 706, the processor identifies each adjacent p-MOSFET on a first side of the found node for which there is a corresponding n-MOSFET on the opposite side of the found node. The processor continues to search for another adjacent p-MOSFET on the first side of the found node and another adjacent n-MOSFET on the opposite side, until either no additional p-MOSFET is found on the first side, or no additional n-MOSFET is found on the opposite side.

At step 710, steps 712 and 714 are performed for each identified circuit having matching p-MOSFETs and n-MOSFETs.

At step 712, each of the identified p-MOSFETs is assigned to a first one of the tiers (where the first tier can be the upper tier or the lower tier).

At step 714, each of the identified n-MOSFETs is assigned to a second one of the tiers different from the first tier (where the second tier can be the lower tier or the upper tier).

Figure 8:
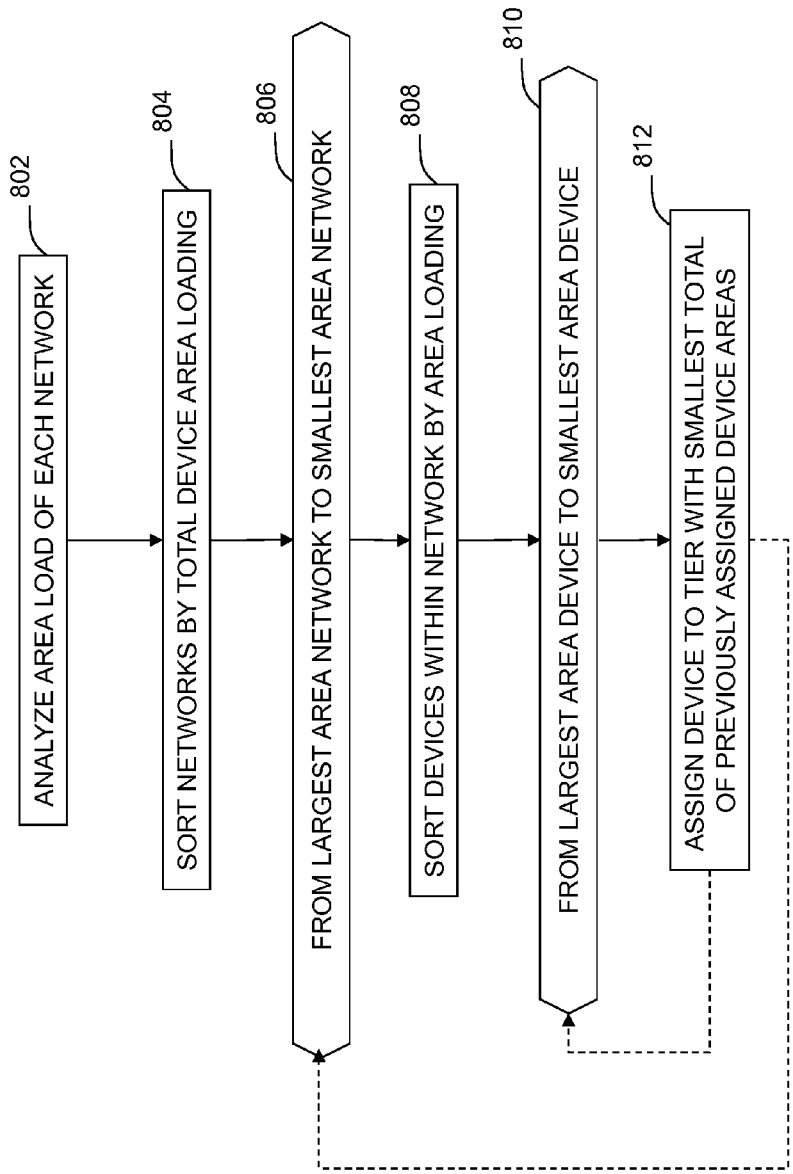
FIG. 8 is a flow chart of the tier balanced partitioning of FIG. 4.

FIG. 8 is a detailed flow chart of a method for performing the tier-balanced partitioning step 414 of FIG. 4.

At step 802, the processor analyzes the area load of each remaining network (third circuit) which has not been grouped and partitioned in steps 408 and 410, and has not been assigned in the geometry matching step 412. For each of the remaining networks, the number of devices of each type in the network is determined, and the number of devices is multiplied by the area (product of length times the width) for that type of device.

At step 804, the processor sorts the selected subset of second devices corresponding to the remaining networks by device area, from the largest network to the smallest network.

At step 806, the loop containing steps 808, 810 and 812 is performed for each of the networks sequentially, from the largest to the smallest network.

At step 808, the processor sorts the devices within the network by device area.

At step 810, step 812 is performed for each of the devices in the network sequentially, from the largest device to the smallest device.

At step 812, the processor sequentially assigns each respective device of the network to be fabricated in a respective one the tiers of the 3D IC which has a smallest total area of devices assigned to that one tier before assigning that respective device of the network.

Figure 9:
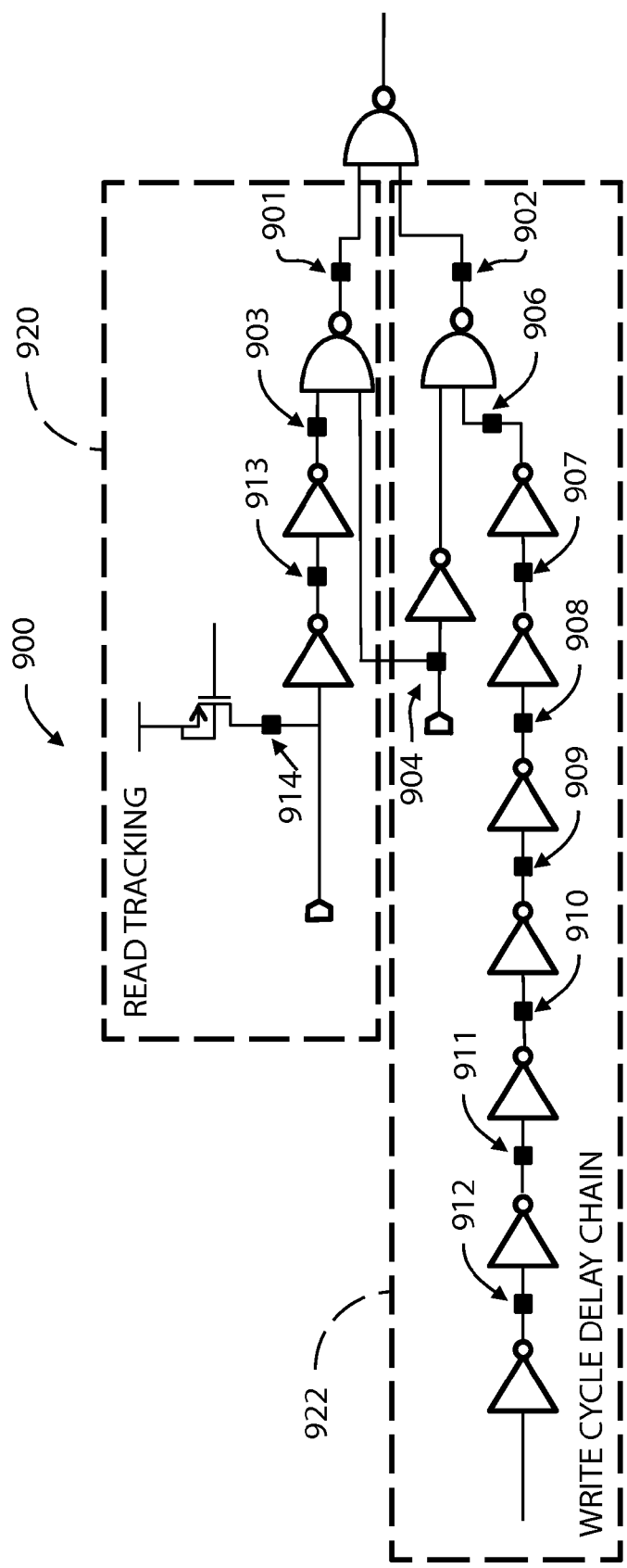
FIG. 9 is an example of a circuit to be assigned by the tier balanced partitioning of FIG. 8.

FIG. 9 shows an example of an SRAM sense enable generation circuit 900 within a circuit design to be assigned according to the method of FIG. 8. Thus, in this example, it is assumed that the sense enable generation circuit was not previously grouped for assignment to a single tier, and the devices of the sense enable generation circuit were not all assigned by the group matching process. (In other examples, all of the inverters and NAND gates of this sense enable generation circuit 900 are partitioned during the geometry matching step. However, the complete circuit 900 is partitioned by the tier-balanced method for purpose of example).

The sense enable generation circuit 900 includes a read tracking block 920 and a write cycle delay chain 299. The circuit design includes a plurality of inverters 904-913 a plurality of NAND gates 901-903, and an n-MOSFET 914. For each of these devices, the processor determines a network area loading corresponding to the area of that device.

In the example, each inverter has one p-MOSFET and one n-MOSFET. Each NAND gate has two p-MOSFETs and two n-MOSFETs. The area of each inverter is determined by the sum of the area of one n-MOSFET and the area of one p-MOSFET. The area of each NAND is determined by the sum of (two times the area of one n-MOSFET) and (two times the area of one p-MOSFET). The respective area loading of each network is determined from these computations.

The networks are sorted from largest to smallest. In this example, networks 902, 903 and 904 have the largest, 2nd largest and third largest areas. Within each network, beginning with network 902, the individual devices are sorted from largest to smallest, and then partitioned in sequence from largest device to smallest device. Thus, as each device is assigned, the balance between the total areas assigned to each tier improves. Table 4 shows the total assigned area in each tier. When network 902 is assigned, the tier loading is equal (0.0864 µm² per tier). Then, when network 903 is assigned, the area assigned to tier 1 is slightly larger. Assignment of the next network 904 assigns greater area to tier 2, bringing the two tiers back into balance. When network 913 is assigned, the area loading of tier 1 becomes larger again (50.9% versus 49.1%). Then, when network 914 is assigned, devices occupying more area are assigned to tier 2 to reduce the difference between totals. The final area balance between tiers is 49.2% in tier 1 and 50.8% in tier 2.

TABLE 4

| Tiers | net 902 | net 903 | net 904 | net 912 | net 913 | net 914 | Balance |
|---|---|---|---|---|---|---|---|
| tier 1 area (µm²) | 0.0864 | 0.1008 | 0.108 | 0.1944 | 0.2088 | 0.2088 | 49.2% |
| tier 2 area (µm²) | 0.0864 | 0.0936 | 0.108 | 0.1944 | 0.2016 | 0.2160 | 50.8% |

The above described methods permit the user to substantially equalize the area loading of each tier, to permit the maximum shrinkage for the target process technology. Depending on how close the shrinkage is to the ideal 50% split for migrating from a single tier to two tiers, the user can make additional adjustments to the partitioning to improve the balance. Alternatively, the user can add dummy devices to the tier having a smaller total area load, to further reduce any difference between the total area of devices assigned to each tier.

Figure 10:
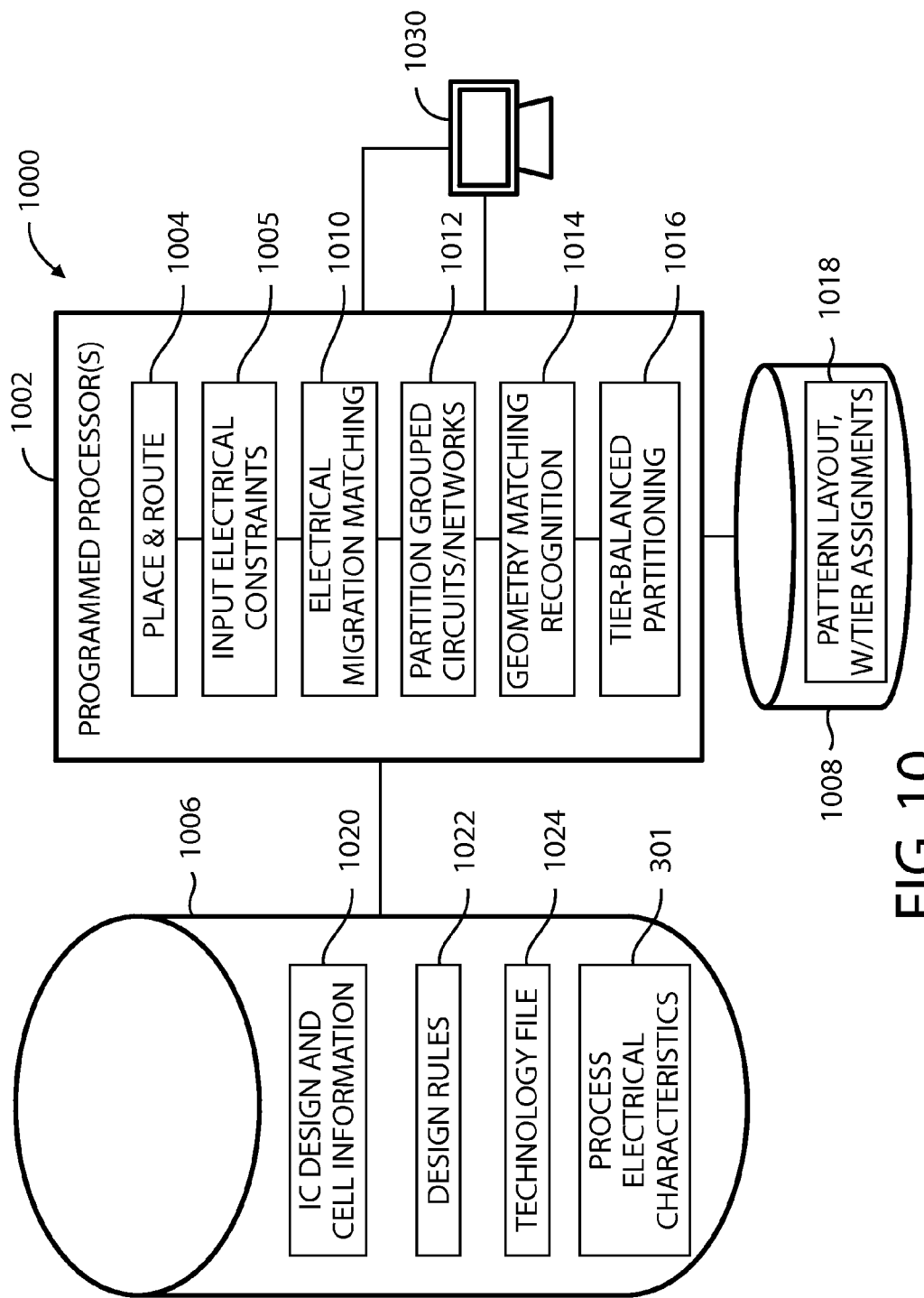
FIG. 10 is a block diagram of a system according to some embodiments.

FIG. 10 is a block diagram of a system for performing the method described herein.

FIG. 10 is a block diagram of a system 1000 for providing layouts and performing the multi-patterning decomposition for the layer of the substrate, according to one embodiment. Block 1002 indicates that one or more programmed processors may be included. In some embodiments, the processing load is performed by two or more application programs, each operating on a separate processor. In other embodiments, the processes are all performed using one processor. Similarly, two non-transitory machine readable storage media 1006 and 1008 are shown, but the data may be stored in any number of media. Although FIG. 10 shows an allocation of the various tasks to specific modules, this is only one example. The various tasks may be assigned to different modules to improve performance, or improve the ease of programming.

System 1000 includes an electronic design automation ("EDA") tool such as "IC COMPILER" ™, sold by Synopsys, Inc. of Mountain View, Calif., which may include a place and route tool 1004, such as "ZROUTE" ™, also sold by Synopsys. Other EDA tools may be used, such as the "VIRTUOSO" custom design platform or the Cadence "ENCOUNTER" ® digital IC design platform may be used, along with the "VIRTUOSO" chip assembly router 1004, all sold by Cadence Design Systems, Inc. of San Jose, Calif.

The EDA tool is a special purpose computer formed by retrieving stored program instructions from a non-transient computer readable storage medium 1006 and executing the instructions on a general purpose processor 1002. Thus, the instructions configure the logic circuits of the processor 1002 to function as an EDA tool. Examples of non-transient computer readable storage mediums 1006, 1008 include, but are not limited to, hard disk drives (HDD), read only memories ("ROMs"), random access memories ("RAMs"), flash memories, or the like. Tangible, non-transient machine readable storage mediums 1006, 1008 are configured to store data generated by the place and route tool 1004.

The router of the place and route tool 1004 is capable of receiving an identification of a plurality of cells to be included in an integrated circuit ("IC") or interposer layout, including a netlist 1020 containing pairs of cells within the plurality of cells to be connected to each other. Router 1004 may be equipped with a set of default design rules 1022 and technology file 1024. The medium 1006 also contains the PEC database 301, including the process electrical characteristics and dimensions (or area) of each device.

A module 1005 queries the user to input electrical constraints, such as designer selection of devices, circuits or networks to be grouped together to ensure impedance matching is maintained.

In some embodiments, a graphical interface facilitates the design process by displaying the design layout or portions of the layout, such as those described above on a display 1030. The display 1030 allows the designer to view the main function blocks (e.g., IP blocks) and to select any network to be included in a group of devices to be included in a single partition (tier).

A module 1010 performs electrical migration matching. The module receives the circuit design, and designations of the first (old) technology and second (new) process technology. The module 1010 identifies each core device (e.g., transistor, diode, capacitor, varactor or the like) in the received circuit design. The module 1010 queries the PEC database 301 to find corresponding devices fabricated by the target second process technology which have the same or similar PEC as corresponding devices made by the first process. In some embodiments, if a single second device is found having the same PEC as the first device, the module 1010 automatically selects that found device to be substituted for the first device. In other embodiments, module 1010 asks the user to confirm the selection, even if the found device is the only exact match. In some embodiments, if two or more second devices are found having PEC the same as or close to the PEC of the first device, the PEC of all the found second devices are displayed, to allow the user to select one of the second devices.

A module 1012 partitions the networks and circuits previously grouped by the designer (such as IP blocks, analog circuits, memory blocks, or other circuits sensitive to impedance matching. The module sorts the groups by area, from largest to smallest. Then, beginning with the group having the largest area, the module determines which tier has the smallest total of previously assigned groups, and assigns the next group is assigned to the tier having the smallest total area. For each successive group, the steps of computing the total area of each tier and assigning that group to the tier having the smallest total area are repeated.

A geometry matching module 1014 recognizes symmetry between n-MOSFETs and p-MOSFETs within a network of the design, assigns the n-MOSFETs of that network to one tier and assigns the p-MOSFETs of that network to another different tier. In some embodiments, module 1014 is configured to search for a node that is directly connected to an adjacent n-MOSFET and an adjacent p-MOSFET. When such a node is found, the module 1014 searches for additional adjacent matching n-MOSFET, p-MOSFET pairs connected to the found n-MOSFET, p-MOSFET pair. This search is repeated until no more complete, connected n-MOSFET, p-MOSFET pairs are found.

A tier balance partitioning module 1016 determines the total areas of remaining networks, sorts the remaining networks from largest total area to smallest total area, and sequentially partitions each network from the largest to the smallest. Within each network module 1016 sorts the devices by device area, and sequentially assigns each device (from the largest device to the smallest) to the tier having the smallest total area of previously assigned groups, networks and devices.

The pattern layout with tier assignments 1018 are then stored in a non-transitory machine-readable storage medium 1008.

In some embodiments, a method comprises: receiving a circuit design comprising networks of first devices fabricated by a first fabrication process; selecting second devices to be fabricated by a second process; substituting the second devices for the first devices in the networks of the circuit design; sorting the second devices within a selected one of the networks by device area from largest device area to smallest device area; and assigning each second device in the selected network to be fabricated in a respective one of a plurality of tiers of a 3D IC for which a total area of second devices previously assigned to that tier is smallest, the second devices being assigned sequentially according to the sorting.

In some embodiments, the selecting includes selecting a first subset of a plurality of second devices to be fabricated by a second process, the first subset including ones of the plurality of second devices which most closely match electrical characteristics of the corresponding first devices.

Some embodiments further comprise retrieving the electrical characteristics and dimension s for the plurality of second devices from a table stored in a non-transitory, machine readable storage medium, before the selecting step.

In some embodiments, each network has a plurality of second devices and a total device area, and the method further comprises sorting the plurality of networks by the total device area of each respective network, wherein for each respective network, the devices of that respective network are assigned sequentially according to the sorting of the plurality of networks by device area.

Some embodiments further comprise: assigning each second device in a second one of the networks to a single one of the plurality of tiers.

In some embodiments, the step of assigning each of the second devices in the second network is performed before the step of assigning each of the second devices in the first network.

In some embodiments, the second network comprises an analog circuit.

In some embodiments, the second network comprises a custom logic circuit.

In some embodiments, the second network comprises a memory circuit.

Some embodiments further comprise: identifying at least one additional circuit included in the circuit design, wherein the additional circuit includes an equal number of p-metal oxide semiconductor field effect transistors (p-MOSFET) and n-MOSFET devices; assigning each of the p-MOSFET devices in the additional circuit to a first single one of the plurality of tiers; and assigning each of the n-MOSFET devices in the additional circuit to a second single one of the plurality of tiers different from the first single one of the plurality of tiers.

Some embodiments further comprise: identifying a second additional circuit included in the circuit design, wherein the second additional circuit includes an equal number of p-MOSFET and n-MOSFET devices; assigning each of the p-MOSFET devices in the second additional circuit to the first single one of the plurality of tiers; and assigning each of the n-MOSFET devices in the second additional circuit to the second single one of the plurality of tiers.

In some embodiments, the identifying includes: finding a node adjacent to and between a first p-MOSFET device and a first n-MOSFET device, searching for an additional p-MOSFET sequentially connected on a same side of the found node as the first p-MOSFET, and searching for a corresponding additional n-MOSFET sequentially connected on a same side of the found node as the first n-MOSFET; and repeating the searching until there is no further sequentially connected p-MOSFET on the same side of the first p-MOSFET as the first p-MOSFET, or no corresponding sequentially connected n-MOSFET on the same side of the first n-MOSFET as the first n-MOSFET In some embodiments, the steps of assigning each of the p-MOSFET devices and each of the n-MOSFET devices are performed before the sorting step.

In some embodiments, the additional circuit is one of the group consisting of an inverter, a NAND gate, a NOR gate, and a MOS differential pair circuit. In other embodiments, the additional circuit is any combinational or sequential circuit, such as an inverter, a transmission gate, a NAND gate, a NOR gate, a multiplexer (e.g., a multiplexer acting as a NOT gate), a latch, a flip-flop, an exclusive-OR (XOR) gate, a current mirror circuit, or a differential pair circuit.

In some embodiments, a method comprises; receiving a circuit design comprising networks of first devices fabricated by a first fabrication process; identifying a first one of the networks included in the circuit design, wherein the first network includes an equal number of p-metal oxide semiconductor field effect transistors (p-MOSFET) devices and n-MOSFET devices; selecting a first subset of a plurality of second devices to be fabricated by a second process, the first subset including ones of the plurality of second devices which most closely match electrical characteristics of the devices of the first network; substituting the first subset of the plurality of second devices for the first devices in the first network of the circuit design; assigning each of the p-MOSFET devices in the first network to be fabricated in a first single one of a plurality of tiers of a 3D IC; and assigning each of the n-MOSFET devices in the first subset to be fabricated in a second single one of the plurality of tiers different from the first single one of the plurality of tiers.

In some embodiments, the identifying includes finding a node adjacent to and between an first p-MOSFET device and a first n-MOSFET device, searching for an additional p-MOSFET sequentially connected on a same side of the found node as the first p-MOSFET, and searching for a corresponding additional n-MOSFET sequentially connected on a same side of the found node as the first n-MOSFET; and repeating the searching until there is no further sequentially connected p-MOSFET on the same side of the first p-MOSFET as the first p-MOSFET, or no corresponding sequentially connected n-MOSFET on the same side of the first n-MOSFET as the first n-MOSFET.

In some embodiments, a method comprises receiving a circuit design comprising networks of first devices to be fabricated in a 3D IC having a plurality of tiers; selecting at least a first network, a second network, and a third network within the circuit design, the second network having an equal number of p-metal oxide semiconductor field effect transistors (p-MOSFET) devices and n-MOSFET devices; assigning each device within the first network to be fabricated within a first single tier of the 3D IC; assigning each of the p-MOSFET devices to be fabricated in the first single tier of the 3D IC or a second single tier of the 3D IC; assigning each of the n-MOSFET devices to be fabricated in a single tier of the 3D IC different from the tier to which the p-MOSFET devices are assigned; and assigning each respective device of the third network to be fabricated in one or more respective tiers of the 3D IC based on a total area of devices previously assigned to each tier before assigning that respective device.

In some embodiments, the circuit design includes a plurality of first networks, each having a respective total area, each respective first network having a plurality of devices that are to be assigned to a respective single tier of the 3D IC, and the assigning step includes dividing the plurality of first network among the tiers of the 3D IC so as to balance a respective sum of the total areas of the first networks assigned to each respective tier of the 3D IC.

In some embodiments, the step of dividing the plurality of first networks among the tiers of the 3D IC includes: sorting the first networks by total area from largest to smallest; and sequentially assigning each respective first network to be fabricated in a respective one the tiers of the 3D IC which has a smallest total area of first networks previously assigned to that one tier before assigning that respective first network.

In some embodiments, the step of assigning each respective device of the third network includes: sorting the devices within the third network by device area; and sequentially assigning each respective device of the third network to be fabricated in a respective one the tiers of the 3D IC which has a smallest total area of devices assigned to that one tier before assigning that respective device of the third network.

The methods and system described herein may be at least partially embodied in the form of computer-implemented processes and apparatus for practicing those processes. The disclosed methods may also be at least partially embodied in the form of tangible, non-transitory machine readable storage media encoded with computer program code. The media may include, for example, RAMs, ROMs, CD-ROMs, DVD-ROMs, BD-ROMs, hard disk drives, flash memories, or any other non-transitory machine-readable storage medium, wherein, when the computer program code is loaded into and executed by a computer, the computer becomes an apparatus for practicing any of the methods described herein. The methods may also be at least partially embodied in the form of a computer into which computer program code is loaded and/or executed, such that, the computer becomes a special purpose computer for practicing the methods. When implemented on a general-purpose processor, the computer program code segments configure the processor to create specific logic circuits. The methods may alternatively be at least partially embodied in a digital signal processor formed of application specific integrated circuits for performing the methods.

Although the subject matter has been described in terms of exemplary embodiments, it is not limited thereto. Rather, the appended claims should be construed broadly, to include other variants and embodiments, which may be made by those skilled in the art.

What is claimed is:

1. A computer-implemented system, comprising:
   a non-transitory machine readable storage medium storing data representing a circuit design comprising a plurality of circuits, each circuit comprising a plurality of devices to be fabricated in respective tiers of a three dimensional integrated circuit (3D IC) comprising a plurality of tiers;

a processor which is programmable, configured to:
  group the circuits into a plurality of groups based on at least one of a plurality of categories included in a group consisting of an electrical constraint, a symmetry in circuit patterns, and a network, wherein each group of the plurality of groups has an area; and
  assign the plurality of groups to be fabricated in respective tiers of the 3D IC so as to minimize differences in sizes of areas between a total areas of the groups assigned to each respective tier.

2. The system of claim 1, wherein the electrical constraint includes at least one of drain current, threshold voltage, drain-source transconductance, drain source resistance, gate current, gate capacitance, or off current.

3. The system of claim 1, wherein one of the plurality of circuits includes a plurality of analog devices having active devices, and the processor is configured to group all of the active devices in a single one of the groups.

4. The system of claim 1, wherein one of the plurality of circuits includes a memory having a plurality of devices, and the processor is configured to group all of the devices of the memory in a single one of the groups.

5. The system of claim 1, wherein the processor is configured to group the plurality of circuits by symmetry in a circuit pattern by automatically recognizing a differential pair circuit.

6. The system of claim 5, wherein the programmable processor is configured to include all p-MOSFET devices in the differential pair circuit in a first one of the groups, and to include all n-MOSFET devices in the differential pair circuit in a second one of the groups.

7. The system of claim 1, wherein the processor is programmed to assign one of the plurality of groups by performing:
  sorting the groups by total area of devices in each group, from a largest total area to a smallest total area;
  sorting the tiers by total area of groups assigned to each tier, from a smallest total area to a largest total area; and
  assigning the one of the sorted groups having the largest total area to the one of the sorted tiers having the smallest total area of assigned groups.

8. The system of claim 7, wherein the steps of sorting the groups, sorting the tiers, and assigning are repeated until each of the plurality of groups has been assigned to a respective tier.

9. The system of claim 1, further comprising assigning devices within remaining circuits of the circuit design to respective ones of the plurality of tiers to further reduce differences in size of areas between total areas of devices assigned to each of the plurality of tiers.

10. A computer-implemented method comprising:
  providing a circuit design comprising a plurality of circuits including first circuits and second circuits, each circuit comprising a plurality of devices to be fabricated in a three dimensional integrated circuit (3D IC) comprising a plurality of tiers, each second circuit having a plurality of p-MOSFET devices and a plurality of n-MOSFET devices;
  using a programmable processor for assigning one or more first circuits to be fabricated in a respective one of the plurality of tiers of the 3D IC based on a respective electrical constraint of each first circuit;
  using the programmable processor for assigning each p-MOSFET device in one of the second circuits to be fabricated in a first single one of the plurality of tiers of the 3D IC; and
  using the programmable processor for assigning each n-MOSFET device in the one of the second circuits to be fabricated in a second single one of the plurality of tiers different from the first single one of the plurality of tiers of the 3D IC.

11. The method of claim 10, further comprising assigning a plurality of analog devices to be fabricated in a single one of the plurality of tiers.

12. The method of claim 10, wherein the circuit design includes a memory comprising a plurality of devices, the method further comprising assigning the plurality of devices of the memory to be fabricated in a single one of the plurality of tiers.

13. The method of claim 10, further comprising selecting the one of the second circuits by automatically recognizing a differential pair circuit within the circuit design.

14. The method of claim 10, further comprising assigning additional groups of circuits within the circuit design to respective ones of the plurality of tiers by:
  sorting the additional groups by total area of devices in each additional group, from a largest total area to a smallest total area;
  sorting the tiers by total area of groups assigned to each tier, from a smallest total area to a largest total area; and
  assigning the one of the sorted additional groups having the largest total area to the one of the sorted tiers having the smallest total area of assigned groups.

15. The method of claim 14, wherein the steps of sorting the additional groups, sorting the tiers, and assigning are repeated until each of the plurality of additional groups has been assigned to a respective tier.

16. A non-transitory machine readable storage medium encoded with computer program code that, when executed by a processor, causes the processor to perform a computer implemented method, comprising:
  providing a circuit design comprising a plurality of circuits to be fabricated in a three dimensional integrated circuit (3D IC) comprising a plurality of tiers;
  finding a node adjacent to and between a first p-MOSFET device and a first n-MOSFET device in one of the circuits,
  searching for an additional p-MOSFET device sequentially connected on a same side of the found node as the first p-MOSFET device, and searching for a corresponding additional n-MOSFET device sequentially connected on a same side of the found node as the first n-MOSFET device;
  repeating the searching until there is no further sequentially connected p-MOSFET device on the same side of the first p-MOSFET device as the first p-MOSFET device, or no corresponding sequentially connected n-MOSFET device on the same side of the first n-MOSFET device as the first n-MOSFET device; and
  assigning the sequentially connected p-MOSFET devices to be formed on a first one of the plurality of tiers, and assigning the sequentially connected n-MOSFET devices to be formed on a second one of the plurality of tiers.

17. The non-transitory machine readable storage medium of claim 16, wherein the method further comprises assigning additional groups of circuits within the circuit design to respective ones of the plurality of tiers by:
  sorting the additional groups by total area of devices in each additional group, from a largest total area to a smallest total area;
  sorting the tiers by total area of groups assigned to each tier, from a smallest total area to a largest total area; and assigning the one of the sorted additional groups having the largest total area to the one of the sorted tiers having the smallest total area of assigned groups.

18. The non-transitory machine readable storage medium of claim 17, wherein the steps of sorting the additional groups, sorting the tiers, and assigning are repeated until each of the plurality of additional groups has been assigned to a respective tier.

19. non-transitory machine readable storage medium of claim 16, wherein one of the plurality of circuits includes a plurality of analog devices having active devices, further comprising grouping all the active devices within the analog devices in a single one of the groups.

20. The non-transitory machine readable storage medium of claim 16, wherein one of the circuits includes a memory having a plurality of devices, further comprising grouping all of the devices of the memory in a single one of the groups.

\* \* \* \* \*